United States Patent [19]

Nelson

[11] Patent Number: 4,542,334
[45] Date of Patent: Sep. 17, 1985

[54] INDUCED-SIGNAL CAPACITANCE EFFECT CABLE TRACKING SENSOR

[75] Inventor: Floyd E. Nelson, Oxnard, Calif.

[73] Assignee: The United States of America as represented by the Secretary of the Navy, Washington, D.C.

[21] Appl. No.: 535,488

[22] Filed: Sep. 26, 1983

[51] Int. Cl.[4] .............................................. G01R 27/26
[52] U.S. Cl. ................................ 324/61 R; 324/326; 405/161; 405/160
[58] Field of Search ................... 324/326, 51, 52, 67, 324/61 R, DIG. 1; 405/161, 160; 318/588, 662

[56] References Cited

U.S. PATENT DOCUMENTS

| | | | |
|---|---|---|---|
| 1,289,418 | 12/1918 | Elmen | 324/67 |
| 3,213,360 | 10/1965 | Cook et al. | 324/61 P |
| 3,323,699 | 6/1967 | Bricker | 226/15 |
| 3,338,059 | 8/1967 | Tittle | 324/326 X |
| 3,702,957 | 11/1972 | Wolfendale | 361/280 |
| 4,220,913 | 9/1980 | Howell et al. | 324/326 X |
| 4,317,079 | 2/1982 | Yamamura et al. | 324/326 |
| 4,338,043 | 7/1982 | Biancale et al. | 405/172 |

FOREIGN PATENT DOCUMENTS 2081907 2/1982 United Kingdom ............... 324/326

Primary Examiner—Stanley T. Krawczewicz
Assistant Examiner—Jack B. Harvey
Attorney, Agent, or Firm—Robert F. Beers; Joseph M. St. Amand; Thomas M. Phillips

[57] ABSTRACT

Inductive coupling of a high-frequency signal into a cable to be detected and tracked in a seawater medium for sensing the relative position of the cable with respect to capacitor plates. The capacitor plates are positioned so that in conjunction with the cable a differential capacitor is formed. Relative movement of the capacitor plates with respect to the position of the cable is used to unbalance a Wheatstone Bridge circuit. The output signal from the bridge circuit is proportional to their displacement and is used to provide a guidance signal to realign the capacitor plates and the cable.

1 Claim, 2 Drawing Figures

INDUCED-SIGNAL CAPACITANCE EFFECT CABLE TRACKING SENSOR

BACKGROUND OF THE INVENTION

The present invention relates to tracking ocean submerged cables and more particularly to a sensor for generating guidance signals to control the direction of the tracker.

An unmanned device for automatically tracking and burying existing seafloor communication cables requires a tracking/guidance system to follow the cable as it lies on the ocean floor.

There are several known systems for tracking, such as the sensors of U.S. Pat. Nos. 3,213,360; 3,323,699; 3,702,957; 4,317,079 and 4,338,043. The sensors of U.S. Pat. Nos. 3,213,360; 3,323,699 and 3,702,957 require that all conductive elements, including those in the item being tracked, to be connected into the sensor circuit by hard wire or through ground contacts. If an electrical cable is being tracked, connections to the conductive elements require destruction of the electrical insulation at many locations as the system moves along the cables.

The sensor of U.S. Pat. No. 4,317,079 requires an electric generator be hard wired to the conductors of the cable being tracked. Due to electrical losses in a long cable, the generator must be moved and reconnected to the cable conductors as the cable is tracked, resulting in the destruction of the electrical insulation.

The sensor of U.S. Pat. No. 4,338,043 projects ultrasonic energy toward the object being located and detects the energy reflected back from that object. This system cannot detect an object shielded from the projected ultrasonic energy by the ocean floor or a small object that has an acoustic impedance similar to its environment.

SUMMARY OF THE INVENTION

The present invention provides for a sensor circuit for generating guidance control signals to control a submerged ocean cable tracking device. An inductor couples a high-frequency signal into the conductor portions of a cable that is to be sensed and tracked. A differential capacitor is formed and in conjunction with a Wheatstone bridge circuit senses the position of the cable. The output signal from the Wheatstone bridge circuit is connected to a phase meter that provides the required guidance signal.

OBJECTS OF THE INVENTION

Accordingly, an object of the invention is to provide an ocean cable sensor for providing a guidance signal for the steering of a cable burying vehicle.

Other objects, advantages and novel features of the invention will become apparent from the following detailed description of the invention when considered in conjunction with the accompanying drawings wherein:

DESCRIPTION OF THE PREFERRED EMBODIMENTS

Figure 1:
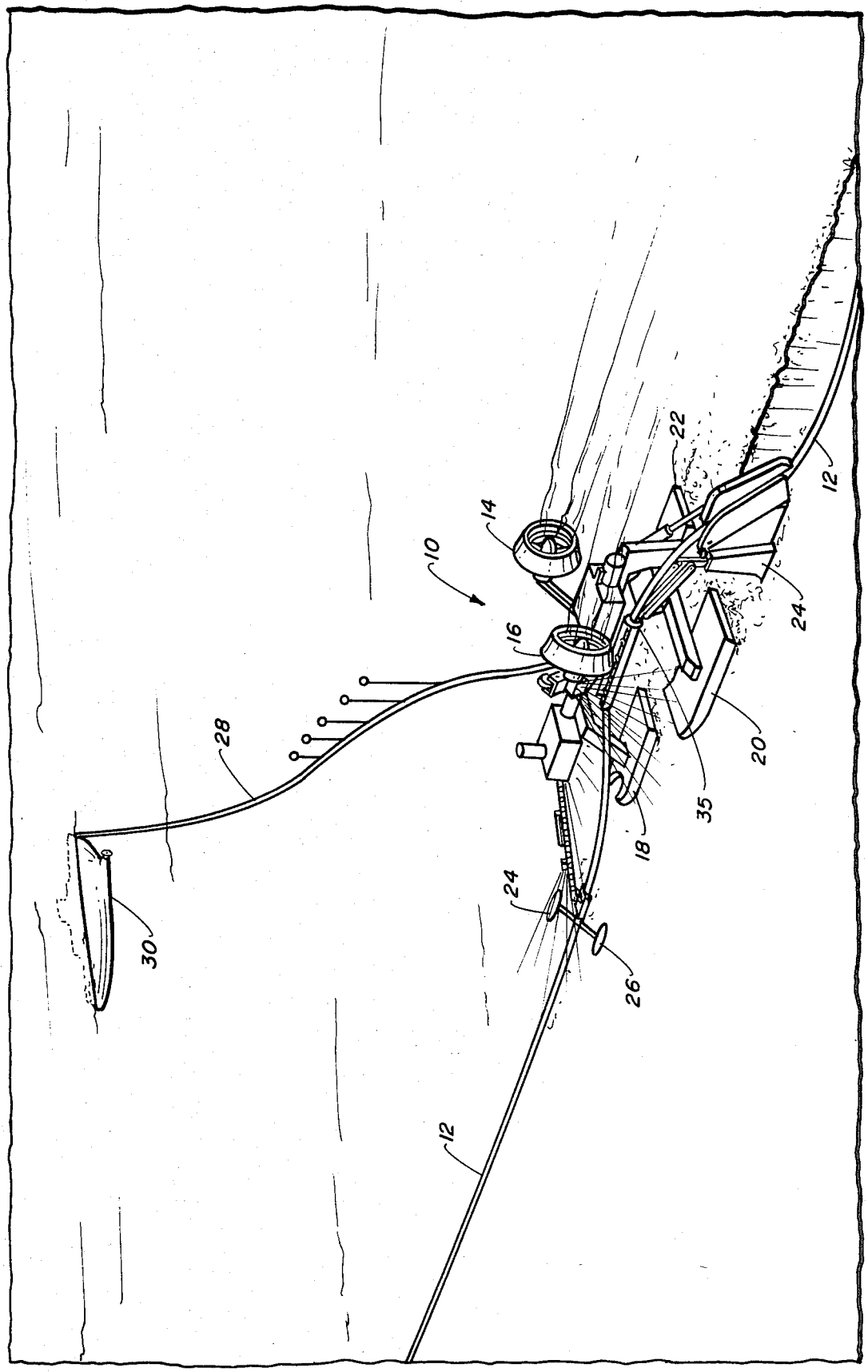
FIG. 1 is a perspective view of the cable burying vehicle in which the invention is utilized.

Referring now to the drawings wherein there is shown in FIG. 1 a cable burial vehicle 10 for burying a communication cable 12. Vehicle 10 is propelled by means of thrusters 14 and 16 which also provide the thrust for steering. Support is provided by a forward skid 18 and two rear skids 20 and 22. A trailing plow 24 digs a trench into which cable 12 is buried. Since cable 12 is already in place on the ocean floor, vehicle 10 must be able to follow along and steer on the position of cable 12. This is accomplished by sensing the position of the cable with respect to two capacitor plates 24 and 26 and generating a guidance signal that is fed to the propulsion units 14 and 16. Power is provided through cable 28 from a mother ship 30.

Figure 2:
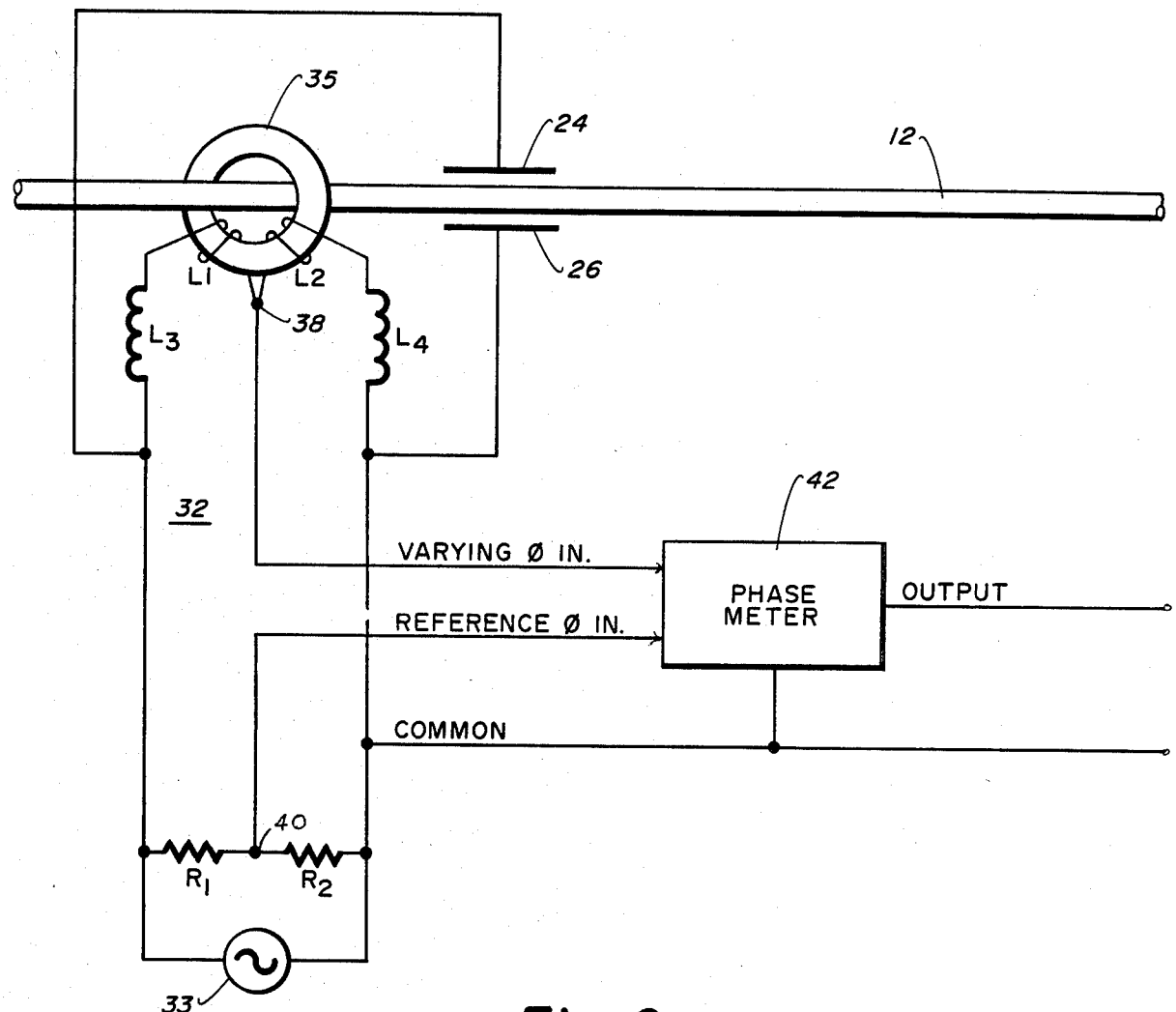
FIG. 2 is a circuit diagram of the sensor circuit for providing guidance signals to the vehicle of FIG. 1.

As shown in FIG. 2, cable 12 is passed through toroidal core 35. Core 35 may be fabricated in two sections in order to allow the placing of it to surround cable 12. In order to cause the vehicle 10 to steer on cable 12, capacitor plates 24 and 26 are mounted on a boom ahead of vehicle 10 (approximately 30 feet). Core 35 is mounted on vehicle 10 (FIG. 1) where the cable 12 can be conveniently passed through.

L1, L2, R1 and R2 form the four arms of a Wheatstone Bridge 32. A high frequency (20–100 KHz) signal source 33 is connected to the input of the bridge circuit 32. L3 and L4 are provided in circuit to prevent overloading of signal source 33. Also connected across the input of bridge circuit 32 are the plates 24 and 26 of a differential capacitor. The output of bridge circuit 32 at terminals 38 and 40 are connected to phase meter 42. The signal applied to inductors L1 and L2 is inductively coupled into cable 12 as it passes through core 35.

A varying output signal is developed as cable 12 is moved between capacitor sensor plates 24 and 26, due to the unbalancing of bridge circuit 32. Inductors L1 and L2 are wound on torodial core 35 through which cable 12 passes so that the high frequency signal can be induced into the cable shield. This makes it possible for the detector to function in sea water. The change in the capacitance as cable 12 moves between plates 24 and 26 cause a variable phase output signal due to the unbalancing of the circuit 32.

In operation, a signal varying in phase is developed at terminal 38 with respect to the phase of the signal at terminal 40. The phase of output signal at terminal 40 is always in phase with the input signal 33 because R1 and R2 of the bridge circuit are non-reactive. The signal is caused by the unbalancing of bridge circuit 32 by the differential capacitor via the cable shield and through coupling inductors L1 and L2. Plates 24 and 26 and the shield of cable 12 form the differential capacitor.

Inductors L1 and L2 are wound on toroidal core 35 and are connected such that their magnetic fields are opposed.

The output from bridge circuit 32 is connected to phase meter 42. The output signal from phase meter 42 is proportional to the difference in phase of the two input signals. Since the input signal to phase meter 42 is proportional to the relative position of cable 12 with respect to sensor plates 24 and 26, the output from phase meter 42 is a varying voltage that varies above and below a reference (0 volts). The polarity of the output signal from phase meter 42 indicates the direction plates 24 and 26 must be moved to center cable 12 between the plates. Since plates 24 and 26 are attached to vehicle 10, it will be steered to maintain cable 12 centered in a vertical plane parallel to capacitor plates 24 and 26. It should be noted that cable 12 does not have to actually be between capacitor plates 24 and 26 and a signal of the proper polarity will continue to be generated to steer vehicle 10 until cable 12 lies in a vertical plane centered between plates 24 and 26. A servo loop is formed which tries to reduce the output of meter 42 to a null.

Obviously, many modifications and variation of the present invention are possible in light of the above teachings. It is therefore to be understood that within the scope of the appended claims the invention may be practiced otherwise than as specifically described.

What is claimed is:

1. Apparatus for burying a submarine cable that has previously been laid on a submerged surface comprising:
   a. a submerged self-propelled vehicle comprising means for driving said vehicle over the surface on which said submarine cable has been laid;
   b. a differential capacitor mounted on a boom in front of said vehicle and in the vicinity of said cable in the direction that said cable extends on the submerged surface;
   c. said differential capacitor having a first capacitor plate positioned in a verticle plane on one side of said cable and a second capacitor plate positioned in a verticle plane on the other side of said cable;
   d. a Wheatstone bridge including two non-reactive arms and two inductive arms, a high frequency signal connected across the inductive arms and across said non-reactive arms;
   e. said inductive arms being inductors wound on a toroidal core through which said cable is passed and injecting said signal into said cable;
   f. said capacitor plates being connected across said inductor arms of said Wheatstone bridge and causing said bridge to unbalance and provide an output signal when said cable is not centered between the two planes of said differential capacitor;
   g. said vehicle driving means being responsive to said output signal to steer said vehicle in a direction to maintain said cable centered between the vertical planes in which said capacitor plates are positioned.

* * * * *